United States Patent [19]

Moore

[11] Patent Number: 4,485,382

[45] Date of Patent: Nov. 27, 1984

[54] TUNING CIRCUITS WITH BENDABLE U-SHAPED VARIABLE INDUCTOR FOR GARAGE DOOR ACTUATORS

[76] Inventor: Charles C. Moore, #8 Elmwood St., Irvine, Calif. 92714

[21] Appl. No.: 396,163

[22] Filed: Jul. 8, 1982

[51] Int. Cl.³ .............................................. H04Q 9/14
[52] U.S. Cl. ................................. 340/825.69; 334/71; 334/46; 334/44; 336/122; 333/185
[58] Field of Search .................... 334/71, 72, 44, 46, 334/15; 340/696, 825.72, 825.69; 455/68, 70, 71; 331/181, 36 L, 177 R; 336/122, 20, 10, 123, 200; 333/185, 174

[56] References Cited

U.S. PATENT DOCUMENTS

| | | | |
|---|---|---|---|
| 1,841,317 | 1/1932 | Carlson | 336/20 |
| 2,560,685 | 7/1951 | Cooper | 333/245 |
| 2,656,517 | 10/1953 | Johnson | 336/122 |
| 2,875,338 | 2/1959 | Holmes | 334/71 |
| 2,880,400 | 3/1959 | Tollefson | 334/44 X |
| 3,422,379 | 1/1969 | Granquist | 334/71 X |
| 3,947,934 | 4/1976 | Olson | 336/200 |
| 4,366,482 | 12/1982 | Remes et al. | 340/825.72 X |

Primary Examiner—Paul L. Gensler
Assistant Examiner—Benny Lee

[57] ABSTRACT

Tuning elements are provided for use in varying the inductance of the oscillatory circuits of the transmitter and receiver units of garage door actuators operating at ultra-high frequencies. Each oscillatory circuit is a closed loop circuit fabricated on a printed circuit board. The closed loop circuit comprises a pair of printed circuit conductive paths having a fixed capacitor connected across one of the ends thereof and a discrete generally U-shaped wire connected across the other of the ends thereof. The conductive paths and the U-shaped wire comprise the inductor of the oscillatory circuit. By bending the discrete U-shaped wire at its connections with respect to the plane of the printed circuit board, the inductance of the oscillatory circuit in each unit can be adjusted as needed so that they both operate at the same resonant frequency.

5 Claims, 6 Drawing Figures

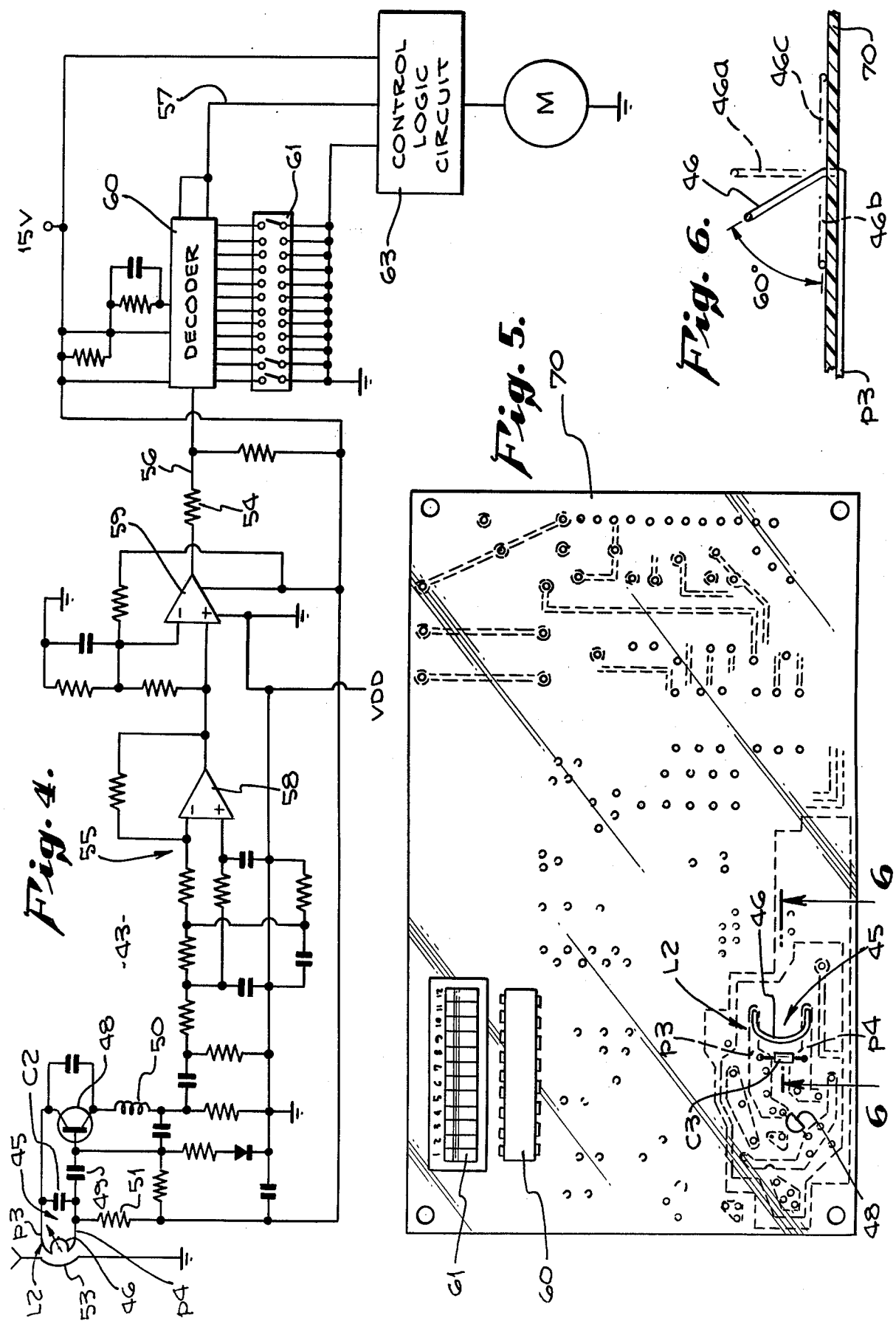

TUNING CIRCUITS WITH BENDABLE U-SHAPED VARIABLE INDUCTOR FOR GARAGE DOOR ACTUATORS

BACKGROUND OF THE INVENTION

This invention relates to transmitter and receiver units for garage door actuators and more particularly to novel elements for tuning the frequency of the oscillatory circuits of these units.

Garage door actuators of the prior art have generally used variable capacitors in the oscillatory circuits thereof, i.e., the tank circuit in the transmitter unit and the tuning circuit in the receiver unit, in order to tune each of these units to operate at the same resonant frequency. Such variable capacitors are relatively expensive components for use in garage door actuators.

A variable inductor comprised of a coil provided with a movable ferrite slug for tuning is sometimes used in the tuning circuits of the receiving units of conventional radio systems. However, when using the specified band of ultrahigh frequencies allocated for garage door actuators by the Federal Communications Commission, such ferrite slug tuned coils are not practical for tuning because the characteristics of the tuning circuit are affected by the capacitance that is introduced by the ceramic-like materials used to form the ferrite slugs.

SUMMARY AND OBJECTS OF THE INVENTION

The invention relates to a tuning element for use in varying the inductance in the oscillatory circuits of the transmitter and receiver units of a garage door actuator. Each of the oscillatory circuits is a closed loop circuit on a printed circuit board carrying a pair of conductive printed circuit paths with a fixed capacitor connected across one of the ends thereof and a discrete generally U-shaped wire connected across the other of the ends thereof. The U-shaped wire and the conductive paths of the closed loop circuit on the printed circuit board comprise the inductive reactance of the oscillatory circuit. By bending the discrete U-shaped wire at its connections with respect to the plane of the printed circuit board on which it is mounted, the inductance of the oscillatory circuit in the transmitter and receiver units can be adjusted as needed so that both these units are operated at the same resonant frequency.

Accordingly, one of the objects of the present invention is to provide a simple and inexpensive tuning element for the oscillatory circuits, i.e., the tank circuit in the transmitter unit and the tuning circuit in the receiver unit, of a garage door actuator.

Still another object of the present invention is to provide a simple tuning element in the form of a discrete generally U-shaped wire forming a portion of an inductor on a printed circuit board that can be used to tune the resonant frequencies of the oscillatory circuits of the transmitter and receiver units of a garage door actuator.

With these and other objects in view, the invention consists of the construction, arrangement and combination of the various parts of the device whereby the objects contemplated are attained as hereinafter set forth, pointed out in the appended claims and illustrated in the accompanying drawings.

BRIEF DESCRIPTION OF THE DRAWINGS

FIG. 4 is a schematic diagram of the electrical circuit of the receiver unit for a garage door actuator which utilizes the tuning element of the present invention;

FIG. 5 is a plan view of a printed circuit board having thereon the circuit of the receiver unit shown in FIG. 4; and FIG. 6 is an elevation view of the portion of the printed circuit board in FIG. 5 showing the tuning element mounted thereon.

DESCRIPTION OF THE PREFERRED EMBODIMENT

Figure 1:
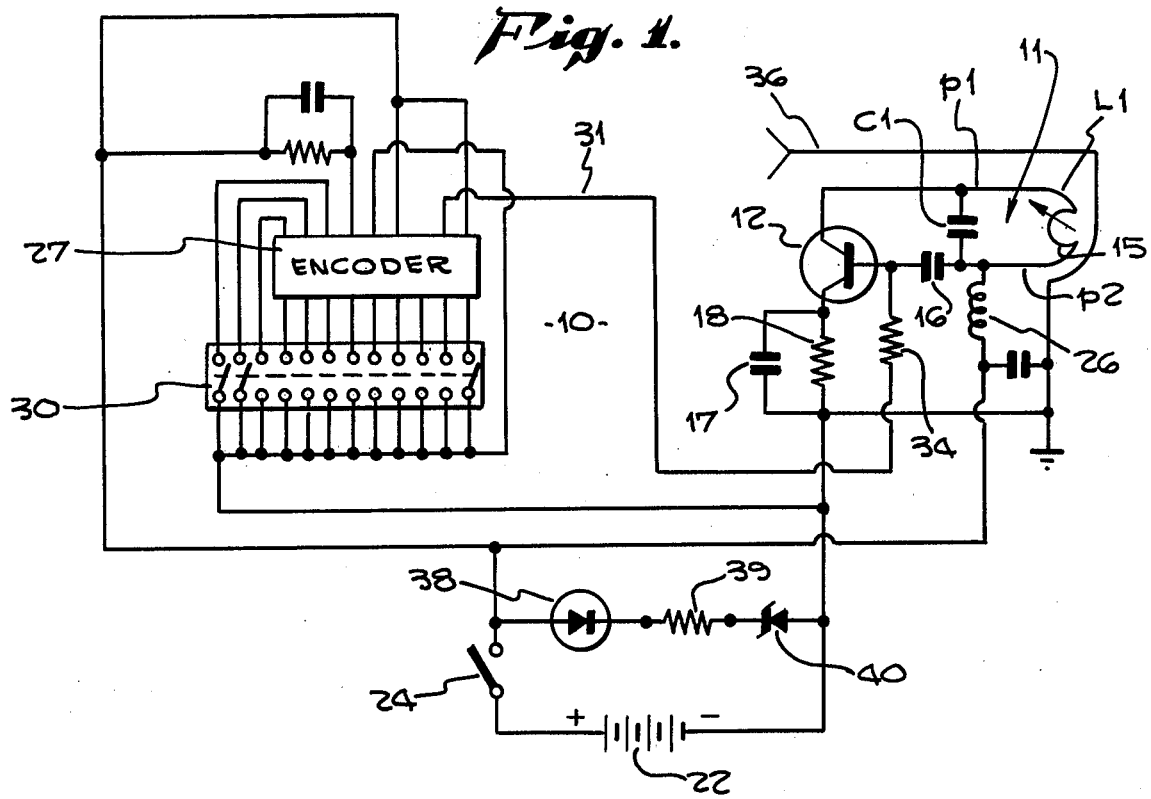
FIG. 1 is a schematic diagram of the electrical circuit of the transmitter unit for a garage door actuator which utilizes the tuning element of the present invention.

Referring to FIG. 1, the schematic diagram of the circuit of a transmitter unit 10 for a garage door actuator is shown to include a transistor 12, an oscillatory or tank circuit 11, an encoder 27, a plurality of two position switches 30, and an antenna 36.

The tank circuit 11 is a closed loop circuit comprised of conductive paths p1 and p2 having a fixed capacitor C1 connected across one of the ends thereof and having a generally U-shaped wire 15 connected across the opposite ends thereof. As will be discussed hereinafter, the conductive paths p1 and p2 and the U-shaped wire 15 comprise a variable inductor L1 in that the U-shaped wire 15 is used as a tuning element for the tank circuit.

One side of fixed capacitor C1 is connected to the collector of the transistor 12 and the other side of capacitor C1 is coupled through a capacitor 16 to the base of transistor 12. The emitter of transistor 12 is connected by a resistor 18 to ground. A capacitor 17 is connected across the resistor 18. The antenna 36 is grounded and positioned so as to be coupled to the conductive paths of the inductor L1.

A battery 22 has its negative terminal connected to ground and its positive terminal connected via a switch 24 through a radio frequency choke coil 26 to the common junction 25 of capacitor C1 and the coupling capacitor 16. The positive terminal of battery 22 is also connected to the power input terminals of encoder 27. The encoder 27 may be a commercially available integrated circuit package of type MM 53200 or other similar commercially available devices. The plurality of two-position switches 30 have their fixed contacts connected to ground and their movable contacts settable for connection to input terminals of the encoder 27. The settings of the two-position switches 30 determine a binary coded pulse train generated on the output 31 of the encoder 27. The output 31 of the encoder 27 is connected through a resistor 34 to the base of transistor 12.

A light emitting diode 38 is connected in series with a resistor 39 and a zener diode 40 across the terminals of the battery 22 when switch 24 is closed. The light emitting diode 38 lights up to indicate that the voltage across the battery 22 is of sufficient value to operate the transmitter unit 10.

When the switch 24 is closed, the battery 22 supplies power to the encoder 27 and the coupling capacitor 16 on the base of transistor 12. The output 31 of the encoder 27 keys the transistor 12 to amplify and modulate, in accordance with the binary coded pulse train, the oscillating or carrier wave which is generated by the tank circuit 11 at a frequency determined by the values of the fixed capacitor C1 and the variable inductor L1. As a result, the signal in greatly amplified form appears at the output of the transistor 12 and is coupled by the paths of the inductor to the antenna 36 which sends out energy in the form of radio waves.

Figure 2:
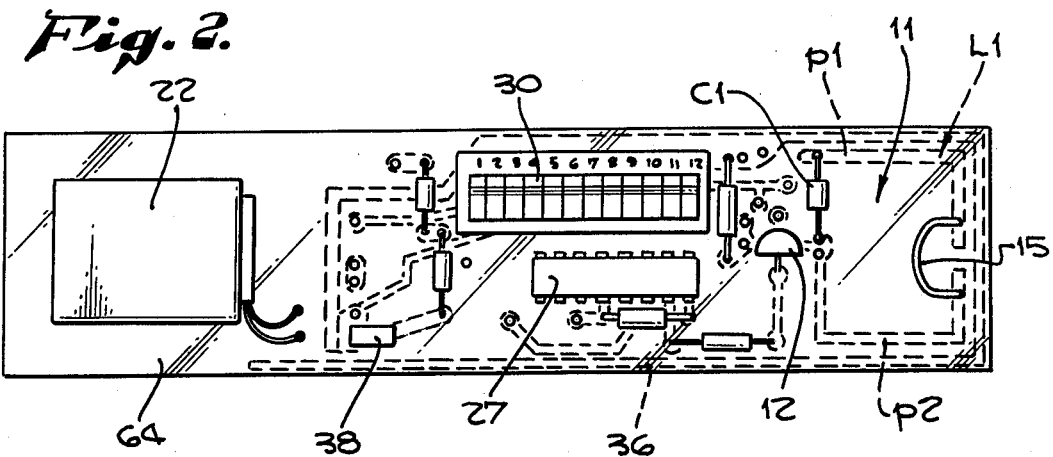
FIG. 2 is a plan view of a printed circuit board having thereon the circuit of the transmitter unit shown in FIG. 1.

The circuit of the transmitter unit 10 shown in FIG. 1 is fabricated on a printed circuit board 64. As shown in FIG. 2, which is a plan view of the printed circuit board 64, the printed circuit paths are illustrated in dashed lines on the printed circuit board 64 since they are formed on the underside thereof. The electrical components of the circuit in FIG. 1 including the discrete U-shaped wire 15 are mounted on the top of the printed circuit board 64 by inserting their terminals through holes provided in the printed circuit board and soldering them to the printed circuit paths. As seen, the tank circuit 11 formed on the printed circuit board 64 includes printed circuit paths p1 and p2 having the fixed capacitor C1 connected to one of the ends thereof and the discrete generally U-shaped wire 15 connected across the opposite ends thereof. The antenna 36 for the transmitter unit 10 is formed by a conductive path of the proper length along the periphery of the underside of the printed circuit board 64, as shown.

Figure 3:
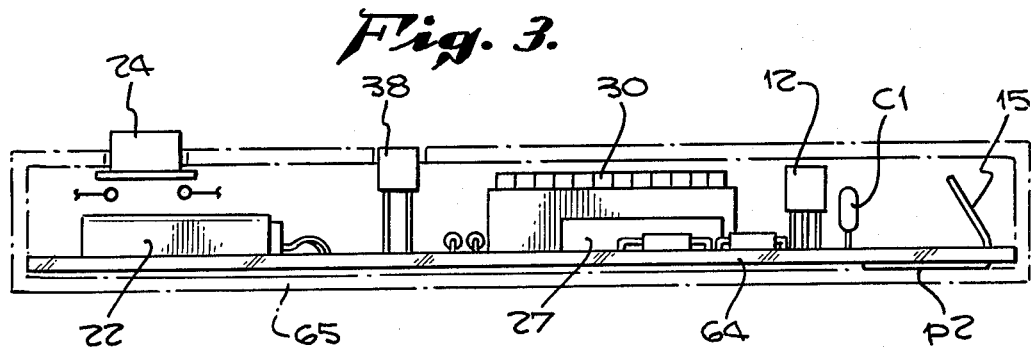
FIG. 3 is an elevation view of the printed circuit board of FIG. 2 enclosed in a casing indicated by phantom lines.

FIG. 3 illustrates an elevation view of the printed circuit board 64 enclosed in a casing 65 indicated by phantom lines. As shown, the U-shaped discrete wire 15 may be initially oriented at an angle of, for example, 60° with respect to the conductive paths p1 and p2 which lie in the plane of the printed circuit board 64. In the preferred embodiment, the movement of the discrete U-shaped wire 15 for tuning the transmitter unit 10 to operate at a particular frequency is limited in its angular adjustment anywhere between the position wherein it is normal to the circuit board 64 and a position wherein it lies parallel to in either direction and over the plane of the conductive paths p1 and p2 forming a portion of inductor L1.

Referring next to FIG. 4, the schematic diagram of the circuit for the receiver unit 43 of the garage door actuator is shown to include a transistor 48, an oscillatory or tuning circuit 45, associated circuits 55, a decoder 60, a plurality of two-position switches 61, and an antenna 53.

The tuning circuit 45 is a closed loop circuit comprised of conductive paths p3 and p4 having connected across one of the ends thereof the fixed capacitor C2 and having connected across the opposite ends thereof a generally U-shaped wire 46. In a manner as discussed in connection with the tank circuit 11 of the transmitter unit 10, the conductive paths p3 and p4 and the generally U-shaped wire 46 comprise the variable inductor L2 of the tuning circuit 45. One side of the capacitor C2 is connected to the collector of the transistor 48 and the other side thereof is coupled by a coupling capacitor 49 to the base of transistor 48. An external source of fifteen volts is connected through a resistor 51 to the common junction of capacitor C2 and coupling capacitor 49. The free-standing antenna 53 is grounded and positioned so as to be coupled to the paths of variable inductor L2. The antenna 53 of the receiver unit 43 receives the modulated carrier wave emitted by the antenna 36 of transmitter unit 10 and causes the oscillatory or tuning circuit 45 to oscillate in accordance therewith.

The emitter of transistor 48 is connected through an inductor 50 to the associated circuits 55 including, among other components, the serially connected operational amplifiers 58 and 59. The transistor 48, together with the associated circuits 55, form a conventional super regenerative oscillator detector and amplifier circuit which serves to reform and amplify the received signals into the binary coded pulse train generated by the encoder 27 in the transmitter unit 10. The binary coded pulse train on the output of the associated circuits 55 is fed through a resistor 54 to the input lead 56 of decoder 60. The plurality of two-position switches 61 are connected to the input terminals of the decoder 60 to generate a binary coded pulse train. Decoder 60 may be the same commercially available integrated circuit package of type MM 53200 provided for the encoder 27 in the transmitter unit 10 or other similar commercially available devices.

The decoder 60 then compares the binary coded pulse train generated therein with the one on the output of associated circuits 55 which has been received from the transmitter unit 10 and if they are the same, provides an output on lead 57 which is fed into a control logic circuit 63.

Referring to FIG. 5, a printed circuit board 70 is illustrated on which the circuit for the receiver unit 43 shown in FIG. 4 is fabricated. In a manner similar to FIG. 2, the conductive paths for the receiver circuit are provided on the underside of the printed circuit board 70 and the electrical components of the circuit (not all of which are shown) including the discrete U-shaped wire 46 are positioned on the top of the printed circuit board 70 and soldered to the ends of the printed circuit paths. In particular, the oscillatory or tuning circuit 45 for the receiver unit 43 is shown to include the printed circuit paths p3 and p4 on the underside of the circuit board 70 and the fixed capacitor C3 and the discrete U-shaped wire 46 on the top of the circuit board 70. The fixed capacitor C3 has its terminals extending through holes in circuit board 70 so as to be soldered to one of the ends of conductive paths p3 and p4. The discrete U-shaped wire 46 has its terminals extending through holes in the circuit board 70 and soldered to the opposite ends of the conductive paths p3 and p4.

It should now be understood that when operating at ultra-high frequencies on the order of 290 MHz and above, the inductance that extends along the length of the conductive paths, such as conductive paths p3 and p4, cannot be ignored since it is appreciable. Accordingly, referring to FIG. 6, by changing the angular positioning of the discrete U-shaped wire 46 relative to the printed circuit conductive paths p3 and p4, it is possible to increase or decrease the total inductance of the inductor L2 and thereby vary the frequency of the tuning circuit 45.

Since the value of the inductance in the tuning circuit 45 is caused by the voltage induced in the circuit itself by the changing magnetic flux therein, anything that affects the amount of this magnetic flux must also affect the inductance. Thus, referring to FIG. 6, when the U-shaped wire 46 is positioned normal to the plane of the printed circuit board 70, as indicated at 46a, it has no affect on the inductance of the tuning circuit, i.e., its affect may be considered neutral. When the U-shaped wire is bent at its connecting terminals so as to lie over the printed circuit board 70, substantially parallel to and over the printed circuit path p3 and p4, as indicated at 46b, the inductance of the tuning circuit is decreased from neutral and the resonant frequency of the tuning circuit 45 is raised. On the other hand, when the U-shaped wire 46 is bent at its connecting terminals so as to lie over the printed circuit board 70, substantially parallel to and away from the printed circuit paths p3 and p4, as indicated at 46c, the inductance of the tuning circuit 45 is increased from neutral and the resonant frequency of the tuning circuit is lowered. In other words, in its position approximately normal to the circuit board 70, the U-shaped wire 46 is at the mid-point of the effective variable range of the inductance of the tuning circuit 45. When the U-shaped wire is bent so as to lie over the paths p3 and p4, its inductance opposes the inductance provided by paths p3 and p4 so as to increase the resonant frequency of the tuning circuit 45. On the other hand, when the U-shaped wire 46 is bent so as to lie outside the paths p3 and p4, its inductance aids the inductance provided by paths p3 and p4 so as to decrease the resonant frequency of tuning circuit 45.

As shown in the drawings, in the preferred embodiment, the U-shaped wire 46 is preferably initially positioned at about 60° with respect to the plane of the circuit board 70 carrying the conductive paths p3 and p4 in order to generally obtain the desired frequency. Then, in order to obtain the particular frequency desired, the U-shaped wire can be readily adjusted with respect to the plane of the circuit board 70 between positions 46a and 46b. It should be appreciated, however, that the full range of movement of the U-shaped wire 46 from position 46b to position 46c on the printed circuit board 70 is available for adjustment of the resonant frequency.

Inasmuch as the fixed capacitor C2 used in the tuning circuit 45 is an inexpensive off the shelf component, the actual value of its capacitance may vary from its rated value by as much as twenty percent. However, even if such an inexpensive wide tolerance capacitor 72 is used, it is relatively easy by use of the tuning element of the present invention to adjust the tuning circuit 45 to operate at a desired frequency. Such adjustment may be made during the fabrication of the printed circuit board by fitting a plastic tool, not shown, over the U-shaped wire 46 and bending the latter at its terminals while observing the frequency of the tuning circuit 45 by use of a frequency counter, for example. If desired, a readily cut setting material may be used to anchor the U-shaped wire 46 in its desired angular position.

In a similar manner the frequency of the tank circuit 11 of the transmitter unit 10 can be adjusted by similarly varying the position of its U-shaped wire 15 on circuit board 64 so that the tank circuit 11 is tuned to the same resonant frequency as the receiver unit 43.

Note that it is desirable to have the adjustment of the tuning elements, such as U-shaped wire 46, provide a broad range of frequencies within the ultra-high frequency band allocated by the Federal Communication Commission for garage door actuators. It has been determined that the length of the conductive path of the U-shaped wire 46 determines the range of variation in inductance that can be obtained by physically adjusting its angle with respect to the plane of the printed circuit board. Accordingly, the length of the U-shaped wire 46 is preferably selected so as to provide a minimum range of, for example, 20 MHz frequency control for the tuning circuit 45 when movable a matter of 20° on either side of its initial position of 60° with respect to the paths p3 and p4. Thus, if the frequency at a 60° setting with respect to the circuit board 70 happens to be 300 MHz, when the U-shaped wire 46 is at, say, 80° with respect to the circuit board 70, the resonant frequency of the tuning circuit 45 may be 290 MHz, and when the U-shaped wire is at 40° with respect to the circuit paths p3 and p4, the resonant frequency of the tuning circuit 45 may be 310 MHz. At intermediate angular positions between these two positions, the resonant frequency varies between 290 and 310 MHz.

Having set the oscillatory circuits of the transmitter unit 10 and the receiver unit 43 to operate at the same desired resonant frequency by use of the tuning elements of the present invention, the encoder 27 of the transmitter unit 10 and the decoder 60 of the receiver unit 43 are set by use of their respective plurality of two-position switches 30 and 61 to generate the same binary coded pulse train indicative of a particular garage door actuator. Thus, if the receiver unit 10 receives a carrier wave on its antenna 53 having a frequency which matches the oscillating operating frequency thereof and if the received carrier wave has been modulated by a binary coded pulse train which matches the binary coded pulse train determined by the setting of the decoder 16, the latter will supply a signal on its output 57 to control logic circuit 63 which operates the motor M to raise or lower the garage door.

From the above description, it will be apparent that there is thus provided a device of the character described possessing the particular features of advantage before enumerated as desirable but which obviously is susceptible of modification in its form, proportions, detailed construction and arrangement of parts without departing from the principals involved or sacrificing any of its advantages. It is to be understood, therefore, that the invention is not limited to the specific features shown but that the means and construction herein disclosed comprise the preferred form of several modes of putting the invention into effect and the invention is claimed in any of its forms or modifications within the legitimate and valid scope of the appended claims.

What is claimed is:

1. In an ultra-high frequency operating transmitter unit and receiver unit of a garage door actuator, a closed loop circuit for use as a tank circuit in the transmitter unit and as a tuning circuit in the receiver unit, each said closed loop comprising:

an insulating board;

a pair of laterally spaced printed-circuit conductive paths formed on the surface of said insulating board;

a fixed capacitor having the terminals thereof connected across one of the ends of said conductive paths; and a tuning element in the form of a generally U-shaped conductive wire extending crosswise to said conductive paths with the terminals thereof respectively connected to the opposite ends of said conductive paths;

whereby each said tank and tuning circuit can be tuned to operate at the same frequency by varying the inductance of said closed loop circuit by bending said U-shaped conductive wire about its terminals to change its angular position with respect to said conductive paths.

2. In an ultra-high frequency operating transmitter and receiver unit of a garage door actuator as defined in claim 1 wherein each said tank circuit and tuning circuit can be tuned to operate at the same frequency by setting said U-shaped conductive wire in an angular position ranging between a position in which it is bent about its terminals toward the conductive paths so as to lie substantially adjacent the surface of the board and a position in which it is bent about its terminals away from the conductive paths so as to lie substantially adjacent the surface of the board.

3. In an ultra-high frequency operating transmitter unit and receiver unit of a garage door actuator as defined in claim 1 wherein the U-shaped conductive wire of each said tank and tuning circuit is of such a length that when bent about its terminals toward the conductive paths so as to be initially positioned at an angle of approximately 60 degrees with respect to the surface of the insulating board, the operating frequency of each the tank and tuning circuits can be typically varied over a range of substantially 20 MHz by bending its U-shaped conductive wire about its terminals approximately 20 degrees in either direction from said initial position.

4. In an ultra-high frequency operating transmitter unit and receiver unit of a garage door actuator as defined in claim 1 wherein in each said closed loop circuit the conductive paths are formed on one surface of said insulating board and said U-shaped conductive wire is mounted on the opposite surface of said insulating board with its terminals extending through holes in the board and soldered to the ends of said conductive paths.

5. In a remote control system for a garage door actuator including an oscillatory circuit in the transmitter unit for controlling the frequency of oscillation of a carrier signal modulated by a binary coded pulse train and an oscillatory circuit in the receiver unit for controlling the frequency of oscillation thereof so that it can receive the modulated carrier signal, each said oscillatory circuit including a closed loop circuit comprising:

an insulating board;
a pair of laterally spaced printed-circuit conductive paths formed on the surface of said insulating board;
a fixed capacitor having its terminals respectively soldered to one of the ends of said conductive paths;
a generally U-shaped conductive wire extending crosswise to said conductive paths with the terminals of its legs respectively soldered to the opposite ends of said conductive paths;
said pair of conductive paths and said U-shaped conductive wire forming a variable inductor in parallel with said fixed capacitor; and
said U-shaped conductive wire being bendable about its terminals so as to vary the angular position of the legs thereof relative to said conductive paths so as to vary the inductance of said inductor and thereby the operating frequency of said oscillatory circuit.

* * * * *